United States Patent
Granger-Jones

(10) Patent No.: US 7,302,011 B1
(45) Date of Patent: Nov. 27, 2007

(54) QUADRATURE FREQUENCY DOUBLING SYSTEM

(75) Inventor: Marcus Granger-Jones, Scotts Valley, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 753 days.

(21) Appl. No.: 10/272,389

(22) Filed: Oct. 16, 2002

(51) Int. Cl.
 H03C 3/00 (2006.01)
 H03K 7/06 (2006.01)
 H04L 27/12 (2006.01)

(52) U.S. Cl. .............. 375/302; 375/222; 375/223; 329/347; 370/125; 381/15; 455/10

(58) Field of Classification Search ........ 375/302, 375/223, 222; 329/347; 370/125; 381/15; 455/110
See application file for complete search history.

(56) References Cited

U.S. PATENT DOCUMENTS

| | | | |
|---|---|---|---|
| 4,454,486 A * | 6/1984 | Hassun et al. | 332/117 |
| 4,612,585 A | 9/1986 | Takase et al. | 358/316 |
| 4,766,497 A | 8/1988 | Banach et al. | 358/188 |
| 4,868,428 A * | 9/1989 | Cooper | 327/248 |
| 5,180,994 A * | 1/1993 | Martin et al. | 331/38 |
| 5,389,886 A | 2/1995 | Popescu | 327/120 |
| 5,479,112 A | 12/1995 | Choi et al. | 326/34 |
| 5,635,866 A | 6/1997 | Monk et al. | 327/116 |
| 5,635,880 A * | 6/1997 | Brown | 331/108 B |
| 5,635,892 A | 6/1997 | Ashby et al. | 336/200 |
| 5,736,749 A | 4/1998 | Xie | 257/3 |
| 5,745,838 A | 4/1998 | Tresness et al. | 455/5.1 |
| 5,838,195 A * | 11/1998 | Szmurlo et al. | 330/149 |
| 6,008,102 A | 12/1999 | Alford et al. | 438/381 |
| 6,031,432 A | 2/2000 | Schreuders | 333/24 R |
| 6,031,746 A * | 2/2000 | Steigerwald et al. | 363/71 |
| 6,194,947 B1 | 2/2001 | Lee et al. | 327/359 |
| 6,198,332 B1 | 3/2001 | O'Toole et al. | 327/356 |
| 6,201,452 B1 * | 3/2001 | Dent et al. | 332/103 |
| 6,211,708 B1 | 4/2001 | Klemmer | 327/122 |
| 6,370,372 B1 * | 4/2002 | Molnar et al. | 455/323 |
| 6,404,255 B1 * | 6/2002 | Filliman et al. | 327/231 |
| 6,433,630 B1 * | 8/2002 | Isoda | 329/307 |
| 6,728,527 B2 * | 4/2004 | Casagrande | 455/313 |
| 2003/0017812 A1 * | 1/2003 | Arimura | 455/112 |
| 2003/0020563 A1 * | 1/2003 | Hieda et al. | 333/164 |
| 2004/0032303 A1 * | 2/2004 | Saito et al. | 331/177 V |

OTHER PUBLICATIONS

Weste, Neil and Kamran Eshraghian, Principles of CMOS VLSI Design: A Systems Perspective, 1985, Addison-Wesley Publishing Company, p. 342.*

(Continued)

Primary Examiner—David C. Payne
Assistant Examiner—Erin M. File
(74) Attorney, Agent, or Firm—Withrow & Terranova, PLLC

(57) ABSTRACT

The frequency doubler of the present invention operates to provide an in-phase signal and a quadrature signal, each having a frequency equal to twice the frequency of a reference signal. The in-phase and quadrature signals are based on signals that are 0 degrees, 45 degrees, 90 degrees, and 135 degrees out of phase with the reference signal. The in-phase signal is provided by multiplying the signals that are 0 degrees and 90 degrees out of phase with the reference signal, and the quadrature signal is provided by multiplying the signals that are 45 degrees and 135 degrees out of phase with the reference signal.

27 Claims, 7 Drawing Sheets

OTHER PUBLICATIONS

Tsuneo Tsukahara and Junzo Yamada, "WP 23.5 to 5GHz Quadrature Modulator and Demodulator Using a Wideband Frequency-Doubling Phase Shifter," 2000 IEEE International Solid-State Circuits Conference, Session 23, Wireless Building Blocks, pp. 384-386.

Shjiva, Sajjan G., "Introduction to Logic Design", Second Edition, University of Alabama in Hunstville, 1998, pp. 142-161.

"Exclusive OR Gate", http://hyperphysics.phy-astr.gsu.edu/hbase/electronic/xor.html, Dec. 10, 2003, 4 pages.

Kang, S. and Leblebici, Y., "GMOS Digital Intergrated Circuits: Analysis and Design", Second Edition, 1999, p. 287.

Lam, C. and Razavi, B., "A 2.6-GHz/5.2-GHz Frequency Synthesizer in 0.4-μm CMOS Technology", IEEE Journal of Solid-State Circuits, vol. 35, No. 5, May 2000, pp. 788-794.

Rategh et al., A CMOS Frequency Synthesizer with an Injection-Locked Frequency Divider for a 5-GHz Wireless LAN Receiver, IEEE Journal of Solid-State Circuits, vol. 35, No. 5, May 2000, pp. 780-787.

Samavati et al., "A 5-GHz CMOS Wireless LAN Receiver Front End", IEEE Journal of Solid-State Circuits, vol. 35, No. 5, May 2000, pp. 765-772.

Wong et al., "A Wide Tuning Range Gated Varactor," IEEE Journal of Solid-State Circuits, vol. 35, No. 5, May 2000, pp. 773-779.

Liu, T. and Westerwick, E., "5-GHz CMOS Radio Transceiver Front-End Chipset", IEEE Journal of Solid-State Circuits, vol. 35, No. 12, Dec. 2000, pp. 1927-1933.

Steyaert et al., "A 2-V CMOS Cellular Transceiver Front-End", IEEE Journal of Solid-State Circuits, vol. 35, No. 12, Dec. 2000, pp. 1895-1907.

* cited by examiner

QUADRATURE FREQUENCY DOUBLING SYSTEM

FIELD OF THE INVENTION

The present invention relates to a frequency doubler, and in particular to a quadrature frequency doubler.

BACKGROUND OF THE INVENTION

Frequency doublers are implemented in a variety of applications where design or physical limitations of a device prevent internal generation of a desired frequency. In such an application, a frequency doubler creates the desired frequency by multiplying two signals together. Typically, two sine wave signals that are 90 degrees out of phase and have the same frequency are multiplied, resulting in a signal having a frequency equal to twice the frequency of the two sine waves.

In many applications, the multiplication of the two sine wave signals in the frequency doubler is accomplished using a single Gilbert cell mixer. In these applications, timing differences between the paths associated with the two signals result in phase errors between the two signals, thereby causing the emergence of even order harmonics of the frequency doubled signal.

Some applications require the generation of quadrature signals from the frequency doubled signal. In these applications, the frequency doubled signal is typically passed through a phase shifter in order to create the quadrature signals having the desired frequency. However, the phase shifter has an associated loss, thereby reducing the signal power and ultimately the signal-to-noise ratio of the quadrature signals at the output of the frequency doubler network. Thus, there remains a need for a quadrature frequency doubler which eliminates the need for the phase shifting of the frequency doubled signal. Further, there remains a need for a quadrature frequency doubler capable of minimizing second order differential and common mode distortion and suppressing even order harmonics of the frequency doubled signal.

SUMMARY OF THE INVENTION

The frequency doubler of the present invention operates to provide an in-phase signal and a quadrature signal, each having a frequency equal to twice the frequency of a reference signal. The in-phase and quadrature signals are based on signals that are 0 degrees, 45 degrees, 90 degrees, and 135 degrees out of phase with the reference signal. The in-phase signal is provided by multiplying the signals that are 0 degrees and 90 degrees out of phase with the reference signal, and the quadrature signal is provided by multiplying the signals that are 45 degrees and 135 degrees out of phase with the reference signal.

In addition, the in-phase and quadrature signals may be passed through filtering circuitry to improve a quadrature accuracy of the quadrature signal. The filtering circuitry operates to adjust the phase of the quadrature signal such that the phase difference between the in-phase signal and the quadrature signal is approximately 90 degrees. The frequency doubler may include double balanced multipliers operating to multiply the signals to produce the in-phase and quadrature signals, thereby suppressing differential and common mode distortion and even order harmonics of the in-phase and quadrature signals. Further, the signals that are 0 degrees, 45 degrees, 90 degrees, and 135 degrees out of phase with the reference signal, and the in-phase and quadrature signals may be differential signals in order to improve the signal-to-noise ratio of the in-phase and quadrature signals.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
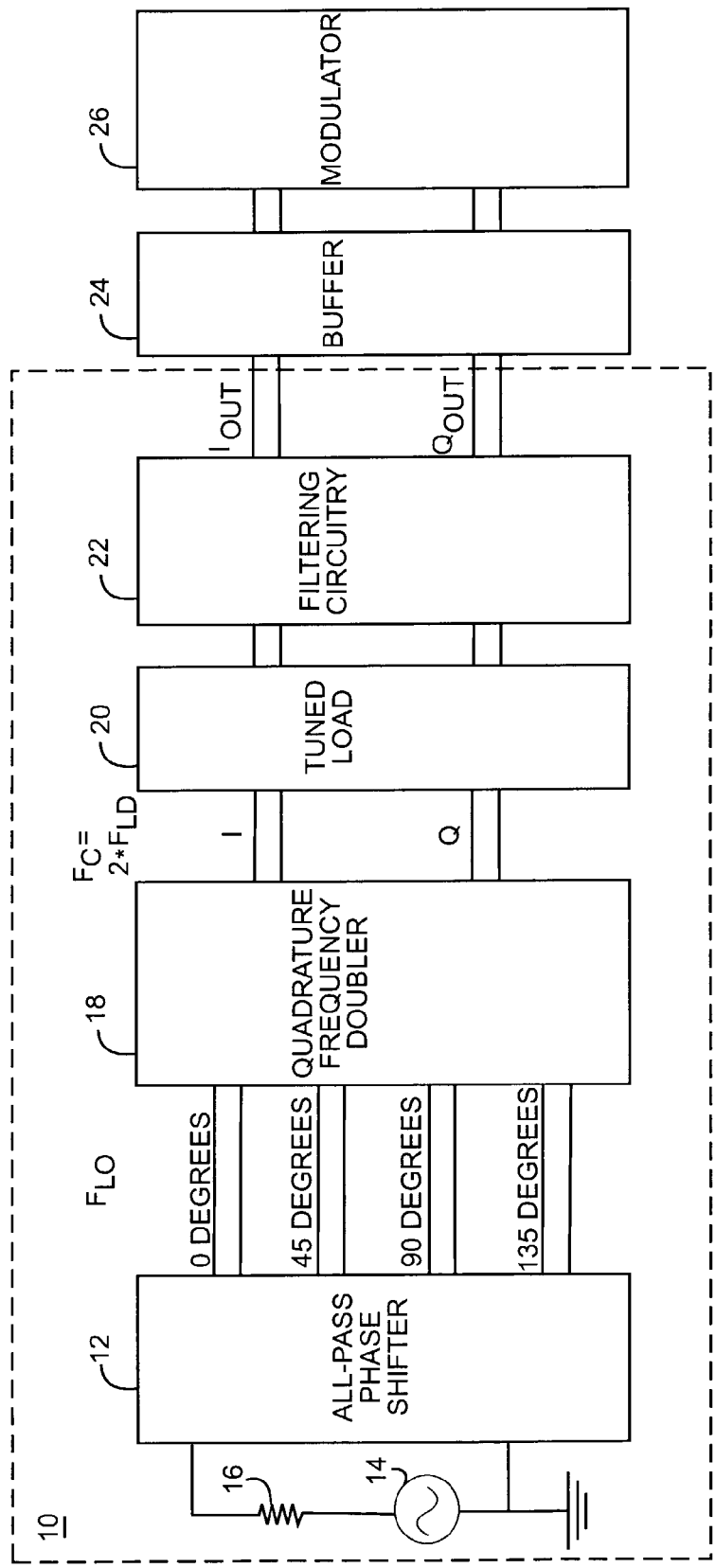
FIG. 1 illustrates a system implementing a quadrature frequency doubler according to one embodiment of the present invention.

The present invention is preferably incorporated in a quadrature frequency doubling system 10. The basic architecture of the system 10 is illustrated in FIG. 1 and may include an all-pass phase shifter 12 being driven by a local oscillator (LO) 14 through a resister 16, a quadrature frequency doubler 18, a tuned load 20, and filtering circuitry 22. The all-pass phase shifter 12 receives a reference signal from the local oscillator 14 and generates a first signal (0 DEGREES) that may be in phase or out of phase with the reference signal, a second signal (45 DEGREES) that is forty-five degrees out of phase with the first signal, a third signal (90 DEGREES) that is ninety degrees out of phase with the first signal, and a fourth signal (135 DEGREES) that is one-hundred and thirty-five degrees out of phase with the first signal. The first, second, third, and fourth signals from the all-pass phase shifter 12 each has a frequency equal to a frequency ($F_{LO}$) of the reference signal from the local oscillator 14.

The quadrature frequency doubler 18 generates an in-phase signal I and a quadrature signal Q, each having a frequency $F_C$ equal to twice the frequency $F_{LO}$ of the reference signal from the local oscillator 14. The in-phase signal I is produced by multiplying the first signal (0 DEGREES) and the third signal (90 DEGREES) from the all-pass phase shifter 12, and the quadrature signal Q is produced by multiplying the second signal (45 DEGREES) and the fourth signal (135 DEGREES) from the all-pass phase shifter 12. Alternatively, the in-phase signal I and the quadrature signal Q may be produced by an exclusive OR (EXOR) of the first and third signals and the second and fourth signals, respectively, from the all-pass phase shifter 12.

The in-phase signal I and the quadrature signal Q are passed to the tuned load 20 in order to maximize a signal-to-noise ratio of the system 10. The tuned load 20 is tuned to the frequency $F_C$ of the in-phase and quadrature signals, thereby maximizing an output power associated with the quadrature frequency doubler 18 and the signal-to-noise ratio of the system 10. Further, the tuned load 20 filters out harmonic distortion from the frequency doubler 18. Without the tuned load 20, the harmonic distortion is passed by the filtering circuitry 22. If present at the input to buffer 24, then intermodulation distortion within the buffer 24 can cause quadrature inaccuracies to develop at the output of the filtering circuitry 22 even if the in-phase signal I and the quadrature signal Q are in perfect quadrature at the frequency $F_C$. In addition, the tuned load 20 is not strictly required and could be either a low pass filter or a notch filter.

After passing through the tuned load 20, the in-phase signal I and the quadrature signal Q are passed through the filtering circuitry 22 to produce an in-phase output signal $I_{OUT}$ and a quadrature output signal $Q_{OUT}$. In one embodiment, the filtering circuitry 22 is a high band passive first order polyphase filter. The filtering circuitry 22 improves a quadrature accuracy of the in-phase signal I and the quadrature signal Q. For example, if the quadrature signal Q is 88 degrees out of phase with the in-phase signal I, the filtering circuitry 22 may improve the quadrature accuracy such that the quadrature signal Q is nearer to 90 degrees out of phase with the in-phase signal I, thereby providing the quadrature output signal $Q_{OUT}$ and the in-phase output signal $I_{OUT}$. The filtering circuitry 22 and the details thereof are commonly known in the art.

The buffer 24 and the modulator 26 illustrate an embodiment in which the in-phase output signal $I_{OUT}$ and the quadrature output signal $Q_{OUT}$ may be used to drive the modulator 26. In this embodiment, the in-phase output signal $I_{OUT}$ and the quadrature output signal $Q_{OUT}$ may be amplified by the buffer 24 before entering the modulator 26. The modulator 26 may use these signals to modulate a baseband signal (not shown) prior to transmission by a wireless communications device (not shown). In addition to the modulator 26, the in-phase output signal $I_{OUT}$ and the quadrature output signal $Q_{OUT}$ may be used in any number of applications, such as demodulation and downconversion. Therefore, the modulator 26 of the system 10 should be considered as exemplary rather than limiting.

Figure 2:
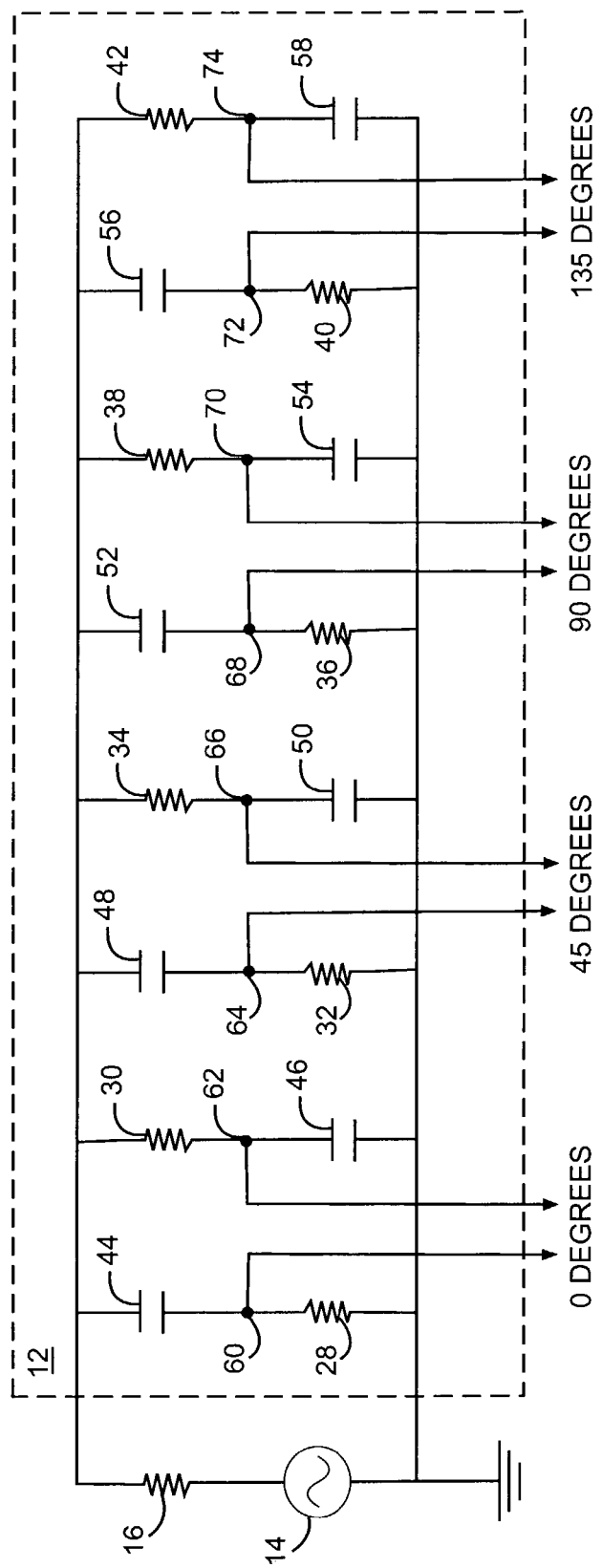
FIG. 2 illustrates an all-pass phase shifter according to one embodiment of the present invention.

FIG. 2 illustrates the all-pass phase shifter 12 in more detail according to one embodiment of the present invention. The all-pass phase shifter 12 is a network of resistors 28, 30, 32, 34, 36, 38, 40, 42 and capacitors 44, 46, 48, 50, 52, 54, 56, 58 that receives the reference signal from the local oscillator 14. The first signal (0 DEGREES), second signal (45 DEGREES), third signal (90 DEGREES), and fourth signal (135 DEGREES) are defined by nodes 60 and 62, 64 and 66, 68 and 70, and 72 and 74, respectively. The resistors 28, 30, 32, 34, 36, 38, 40, 42 and the capacitors 44, 46, 48, 50, 52, 54, 56, 58 have values determined by the particular design of the system 10. In this embodiment, the first signal (0 DEGREES), second signal (45 DEGREES), third signal (90 DEGREES), and fourth signal (135 DEGREES) are differential signals, however these signals may also be single-ended signals.

The phase difference between the reference signal and the first signal (0 DEGREES) may be any phase difference including zero degrees. The second signal (45 DEGREES) is forty-five degrees out of phase with the first signal, which may also be forty-five degrees out of phase with the reference signal. The third signal (90 DEGREES) is ninety degrees out of phase with the first signal, which may also be ninety degrees out of phase with the reference signal. The fourth signal (135 DEGREES) is one hundred and thirty-five degrees out of phase with the first signal, which may also be one hundred and thirty-five degrees out of phase with the reference signal.

Figure 3A:
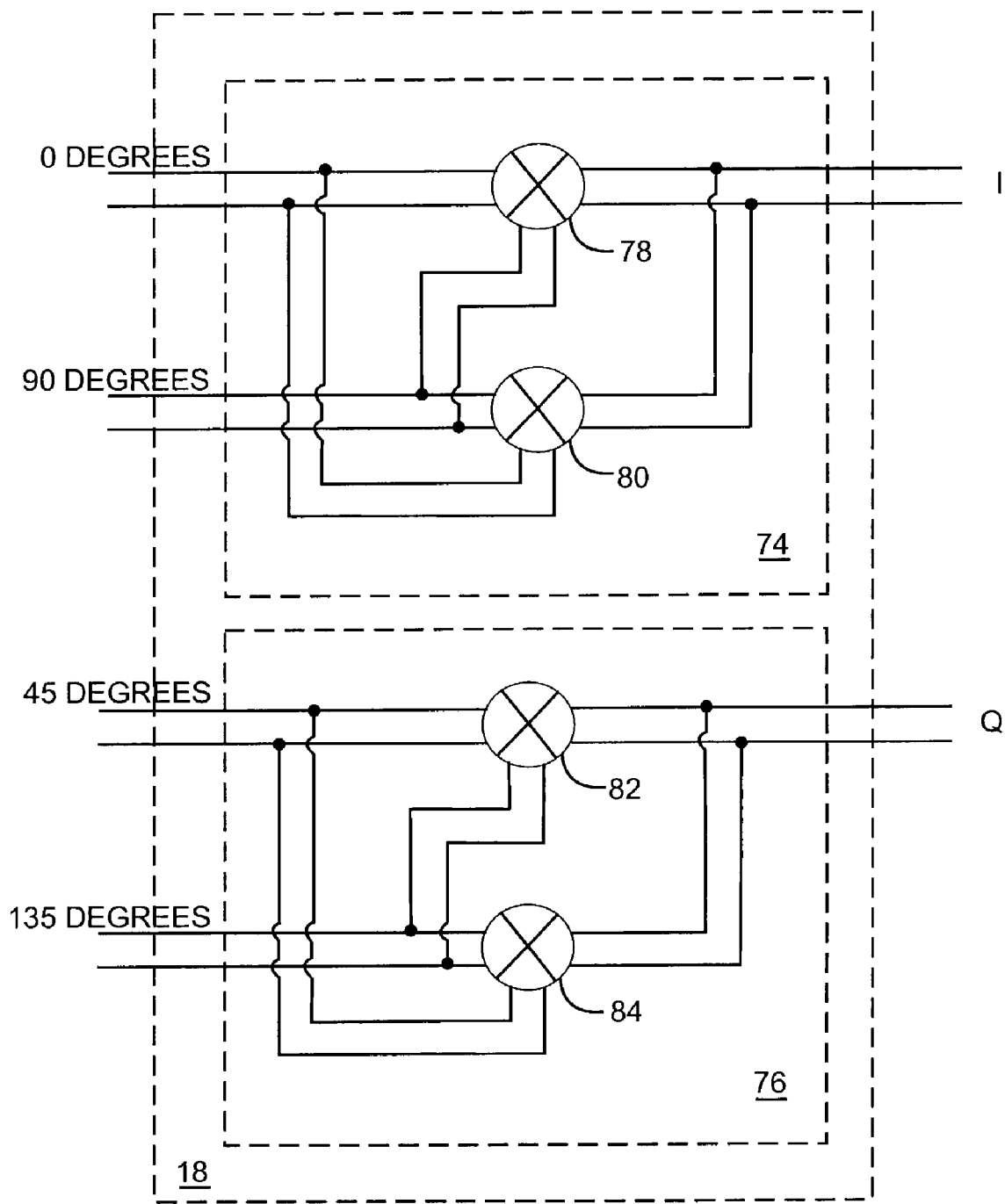
FIG. 3A illustrates a quadrature frequency doubler according to one embodiment of the present invention.

FIG. 3A illustrates the quadrature frequency doubler 18 according to one embodiment of the present invention. The quadrature frequency doubler 18 includes a first double balanced multiplier 74 and a second double balanced multiplier 76. The first double balanced multiplier 74 includes a first mixer 78 and a second mixer 80, thereby defining the first double balanced multiplier 74 as having double balanced mixers. The first mixer 78 receives the first signal, 0 DEGREES, and multiplies it with the third signal, 90 DEGREES. The second mixer 80 receives the third signal, 90 DEGREES, and multiplies it with the first signal, 0 DEGREES. The outputs of the first mixer 78 and second mixer 80 are connected to produce the in-phase signal I having the frequency $F_C$, which is equal to twice the frequency $F_{LO}$ of the first and third signals from the all-pass phase shifter 12.

Similarly, the second double balanced multiplier 76 includes a third mixer 82 and a fourth mixer 84, thereby defining the second double balanced multiplier 76 as having double balanced mixers. The third mixer 82 receives the second signal, 45 DEGREES, and multiplies it with the fourth signal, 135 DEGREES. The fourth mixer 84 receives the fourth signal, 135 DEGREES, and multiplies it with the second signal, 45 DEGREES. The outputs of the third mixer 82 and fourth mixer 84 are connected to produce the quadrature signal 0 having the frequency $F_C$, which is equal to twice the frequency $F_{LO}$ of the second and fourth signals from the all-pass phase shifter 12. The mixers 82 and 84 operate to provide the quadrature signal Q being essentially 90 degrees out of phase with the in-phase signal I.

Figure 3B:
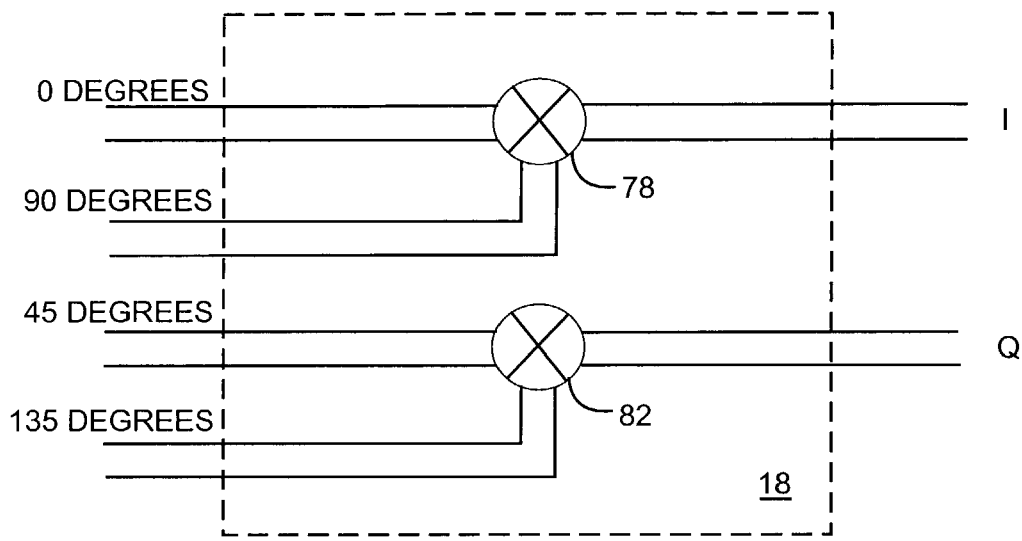
FIG. 3B illustrates a quadrature frequency doubler according to another embodiment of the present invention.

FIG. 3B illustrates an alternative embodiment of the quadrature frequency doubler 18 illustrated in FIG. 3A. In this embodiment, the quadrature frequency doubler includes the mixers 78 and 82. The first mixer 78 produces the in-phase signal I based on the first signal 0 DEGREES and the third signal 90 DEGREES, and the third mixer 82 produces the quadrature signal based on the second signal 45 DEGREES and the fourth signal 135 DEGREES.

Figure 3C:
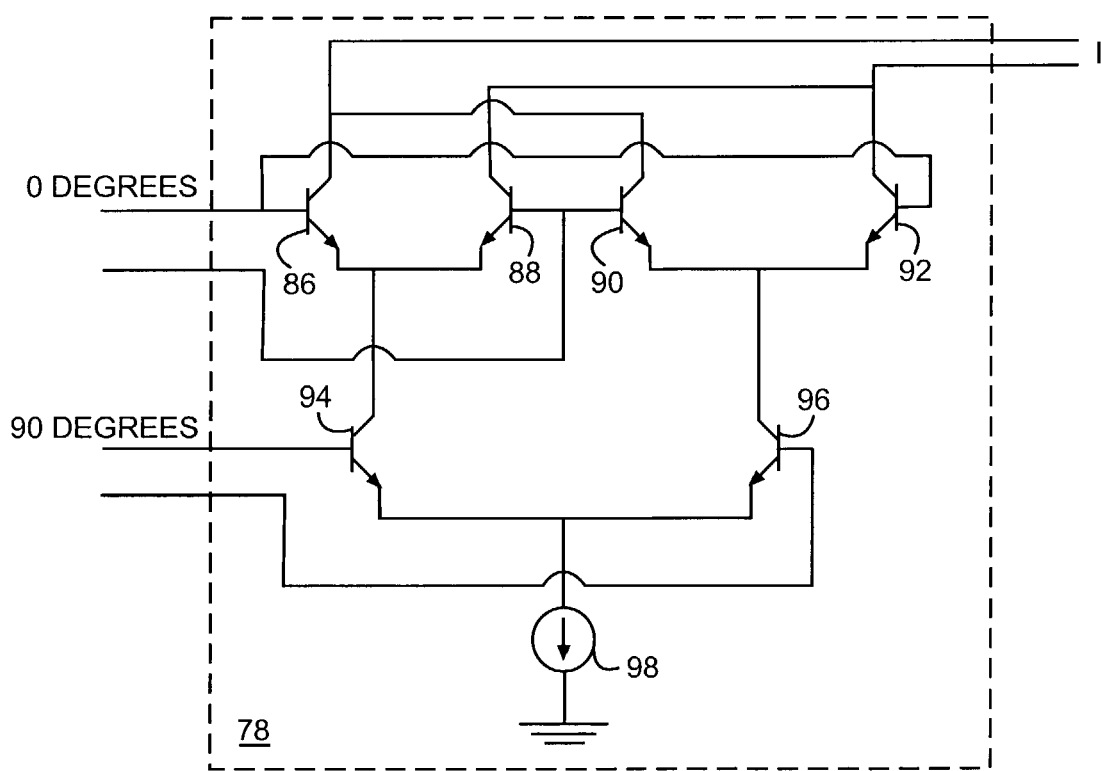
FIG. 3C illustrates a mixer according to one embodiment of the present invention.

FIG. 3C illustrates the first mixer 78 of FIGS. 3A and 3B in more detail. The first signal 0 DEGREES is coupled to a first, second, third, and fourth transistors 86, 88, 90, and 92. The third signal 90 DEGREES is coupled to a fifth and sixth transistors 94 and 96. The fifth and sixth transistors 94 and 96 produce a current through a current source 98 based on the third signal 90 DEGREES. The first, second, third, and fourth transistors 86, 88, 90, and 92 operate to concurrently switch the current through the current source 98 based on the first signal 0 DEGREES, thereby producing the in-phase signal I having the frequency $F_C$, which is twice the frequency of the in-phase signal. Although FIG. 3C illustrates only the first mixer 78, it is to be understood that this discussion applies to the first, second, third, and fourth mixers 78, 80, 82, and 84 of FIGS. 3A and 3B.

Figure 4A:
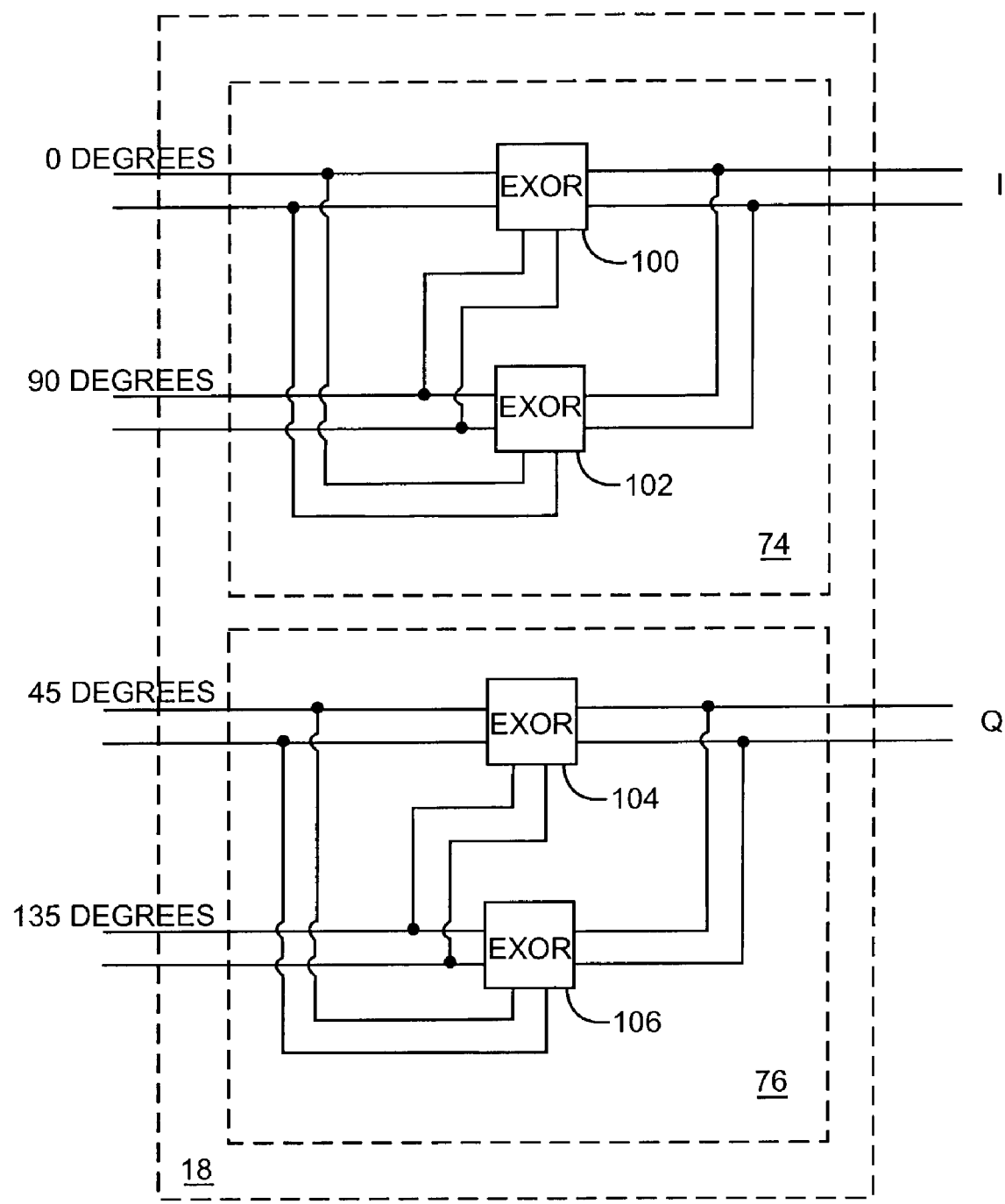
FIG. 4A illustrates a quadrature frequency doubler according to another embodiment of the present invention.

FIG. 4A illustrates another embodiment of the double balanced multipliers 74 and 76 of the quadrature frequency doubler 18. In this embodiment, the first double balanced multiplier includes a first exclusive OR (EXOR) logic 100 and a second EXOR logic 102 operating to produce the in-phase signal I based on performing an EXOR operation on the first signal 0 DEGREES and the third signal 90 DEGREES, where the EXOR operation is known to one of ordinary skill in the art. The first and second EXOR logics 100 and 102 define the first double balanced multiplier 74 as having double balanced EXOR logics. The second double balanced multiplier 76 includes a third EXOR logic 104 and a fourth EXOR logic 106 operating to produce the quadrature signal Q based on performing the EXOR operation on the second signal 45 DEGREES and the fourth signal 135 DEGREES. The third and fourth EXOR logics 104 and 106 define the second double balanced multiplier 76 as having double balanced EXOR logics.

Figure 4B:
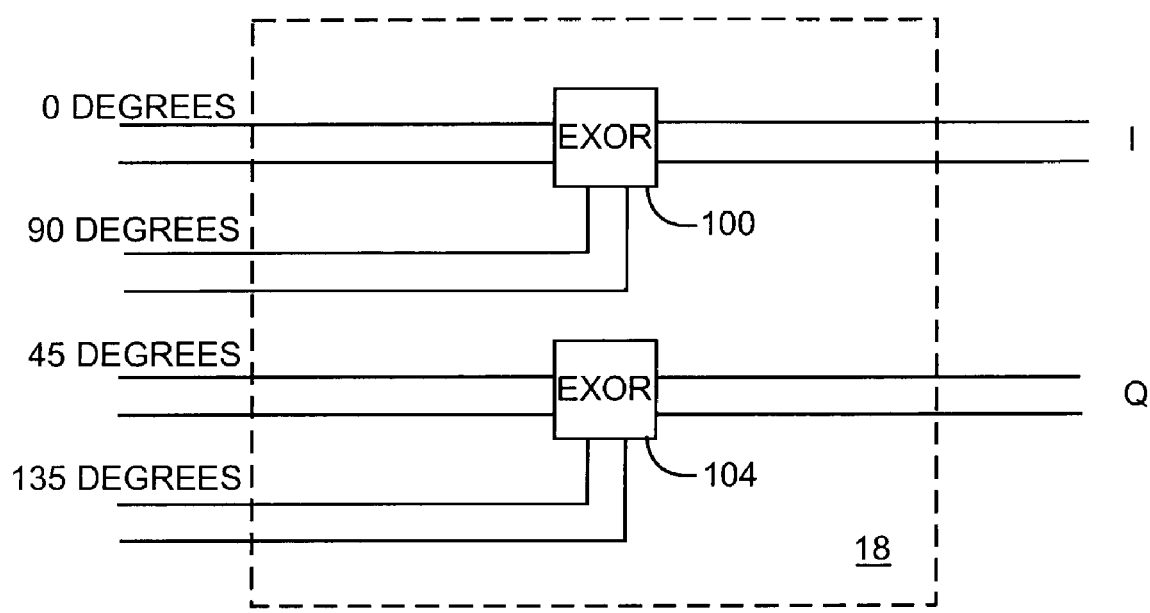
FIG. 4B illustrates a quadrature frequency doubler according to yet another embodiment of the present invention.

FIG. 4B illustrates an alternative embodiment of the quadrature frequency doubler 18 illustrated in FIG. 4A. In this embodiment, the quadrature frequency doubler includes the EXOR logics 100 and 104. The first EXOR logic 100 produces the in-phase signal I based on the first signal 0 DEGREES and the third signal 90 DEGREES, and the third EXOR logic 104 produces the quadrature signal based on the second signal 45 DEGREES and the fourth signal 135 DEGREES.

The use of the first and second double balanced multipliers 74 and 76 illustrated in FIGS. 3A and 4A offer substantial advantages over the mixers 78 and 82 of FIG. 3B and the EXOR logics 100 and 104 of FIG. 4B. The use of the first double balanced multiplier 74 suppresses second order differential and common mode distortion by allowing the first signal, 0 DEGREES, and the third signal, 90 DEGREES, to pass through essentially the same circuitry. Similarly, the second double balanced multiplier 76 suppresses second order differential and common mode distortion by allowing the second signal, 45 DEGREES, and the fourth signal, 135 DEGREES, to pass through essentially the same circuitry. In addition, any common mode signals having a frequency equal to $4 \times F_{LO}$ are also suppressed, since the fourth harmonic generated from the second signal, 45 DEGREES, is 180 degrees out of phase with the fourth harmonic generated from the first signal, 0 DEGREES. In a similar fashion, the fourth harmonics of the third signal, 90 DEGREES, and the fourth signal, 135 DEGREES, are 180 degrees out of phase.

Additionally, the double balanced multipliers 74 and 76 allow for the cancellation of timing differences that typically occur between the inputs of each of the mixers 78, 80, 82, 84 or the EXOR logics 100, 102, 104, 106. By allowing the cancellation of the timing differences, the even order harmonics of the in-phase signal I and the quadrature signal Q are suppressed, where these even order harmonics typically interfere with the improvement of the quadrature accuracy of the in-phase signal I and the quadrature signal Q by the filtering circuitry 22.

Figure 5:
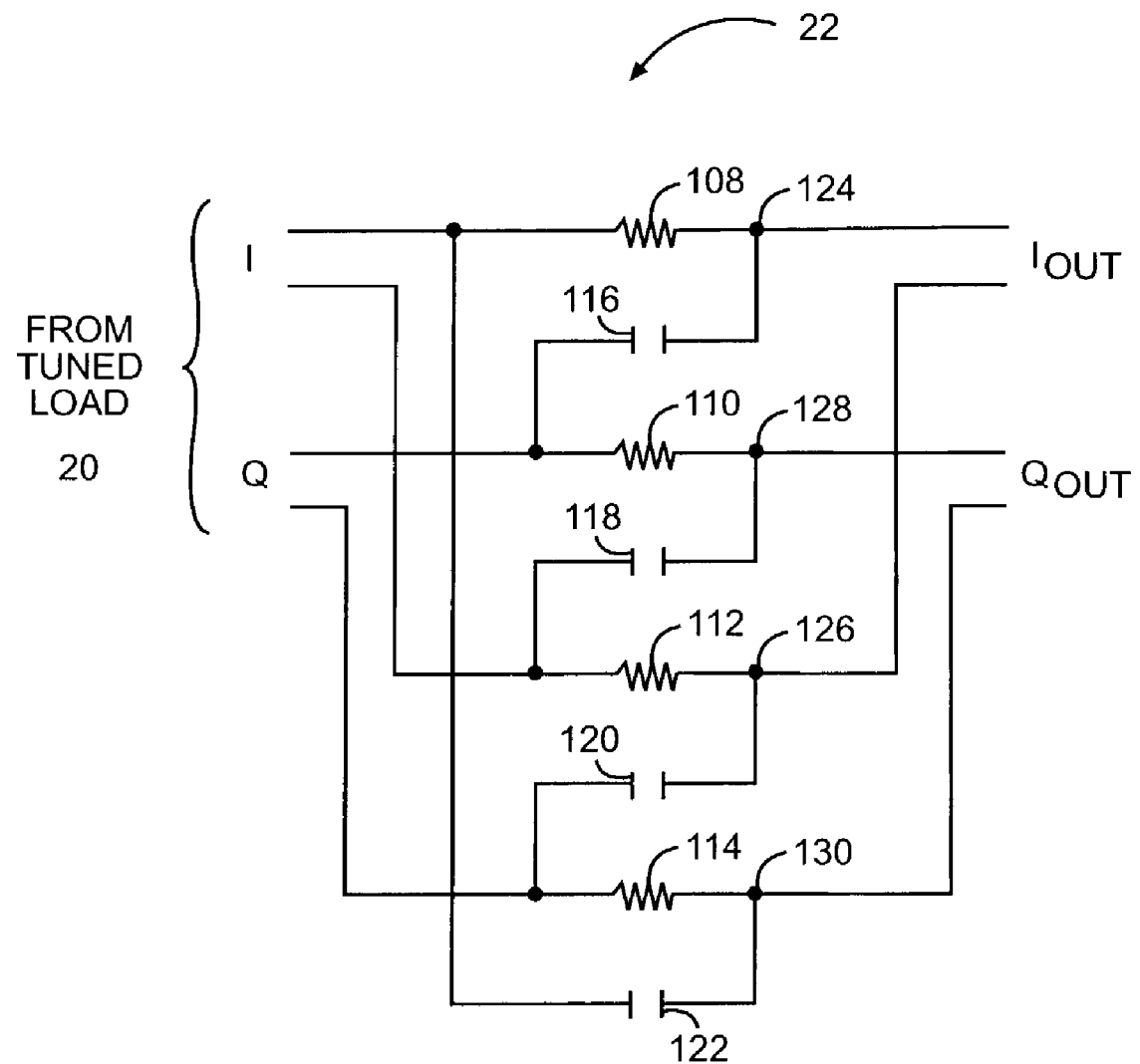
FIG. 5 illustrates filtering circuitry according to one embodiment of the present invention.

FIG. 5 illustrates the filtering circuitry 22 in detail according to one embodiment of the present invention. In this embodiment, the filtering circuitry 22 is the high band passive first order polyphase filter as is commonly known in the art. The filtering circuitry 22 includes filter resistors 108, 110, 112, 114 and filter capacitors 116, 118, 120, 122. The in-phase output signal $I_{OUT}$ is defined by nodes 124 and 126, and the quadrature output signal $Q_{OUT}$ is defined by nodes 128 and 130.

The system 10 offers substantial opportunity for variation without departing from the spirit and scope of the invention. For example, each of the first, second, third, and fourth signals from the all-pass phase shifter 12, the in-phase signal I and the quadrature signal Q from the quadrature frequency doubler 18 and the tuned load 20, and the in-phase output signal $I_{OUT}$ and the quadrature output signal $Q_{OUT}$ from the filtering circuitry 22 are differential signals, thereby providing for common mode rejection and improving the signal-to-noise ratio of the system 10. However, these signals may alternatively be single-ended signals. As another example, the output of the local oscillator 14 has been described and illustrated as a single-ended signal; however, the output of the oscillator 14 may be a differential signal.

The foregoing details should, in all respects, be considered as exemplary rather than as limiting. The present invention allows significant flexibility in terms of implementation and operation. Examples of such variation are discussed in some detail above; however, such examples should not be construed as limiting the range of variations falling within the scope of the present invention. The scope of the present invention is limited only by the claims appended hereto, and all embodiments falling within the meaning and equivalency of those claims are embraced herein.

Those skilled in the art will recognize improvements and modifications to the preferred embodiments of the present invention. All such improvements and modifications are considered within the scope of the concepts disclosed herein and the claims that follow.

I claim:

1. A quadrature frequency doubling system comprising:
    a) first circuitry adapted to provide, in response to receiving a reference signal from an oscillator:
        i) a first signal having a first frequency $F_{LO}$;
        ii) a second signal having the first frequency $F_{LO}$ and being essentially 45 degrees out of phase with said first signal;
        iii) a third signal having the first frequency $F_{LO}$ and being essentially 90 degrees out of phase with said first signal; and
        iv) a fourth signal having the first frequency $F_{LO}$ and being essentially 90 degrees out of phase with said second signal; and
    b) second circuitry adapted to provide an in-phase signal based on said first signal and said third signal and a quadrature signal based on said second signal and said fourth signal,
    wherein said in-phase signal and said quadrature signal have a second frequency equal to twice the first frequency $F_{LO}$ and said quadrature signal is essentially 90 degrees out of phase with said in-phase signal, and wherein said in-phase signal and said quadrature signal are provided to a transmit modulator to modulate a baseband signal.

2. The quadrature frequency doubling system of claim 1 wherein said first circuitry comprises phase shifting circuitry adapted to provide said first, second, third, and fourth signals based on a reference signal.

3. The quadrature frequency doubling system of claim 2 further comprising reference circuitry adapted to provide said reference signal having the first frequency $F_{LO}$ to said phase shifting circuitry.

4. The quadrature frequency doubling system of claim 1 wherein said second circuitry comprises:
   a first multiplier adapted to provide said in-phase signal based on said first and third signals; and
   a second multiplier adapted to provide said quadrature signal based on said second and fourth signals.

5. The quadrature frequency doubling system of claim 4 wherein said first and said second multipliers are double balanced mixers.

6. The quadrature frequency doubling system of claim 4 wherein said first and said second multipliers comprise exclusive OR logic.

7. The quadrature frequency doubling system of claim 1 further comprising filtering circuitry adapted to improve a quadrature accuracy of said in-phase signal and said quadrature signal and thereby provide an in-phase output signal and a quadrature output signal.

8. The quadrature frequency doubling system of claim 1 further comprising a tuned load adapted to maximize an output power associated with said second circuitry, thereby providing said in-phase signal and said quadrature signal having maximum power.

9. The quadrature frequency doubling system of claim 1 wherein said first, second, third, fourth, in-phase, and quadrature signals are differential signals.

10. The quadrature frequency doubling system of claim 1 wherein said first circuitry is further adapted to provide said first, said second, said third, and said fourth signals as differential output signals, and said second circuitry is further adapted to provide said in-phase signal and said quadrature signal as differential signals.

11. A quadrature frequency doubling system comprising:
   a) first circuitry adapted to provide, in response to receiving a reference signal from an oscillator:
      i) a first signal having a first frequency $F_{LO}$;
      ii) a second signal having the first frequency $F_{LO}$ and being essentially 45 degrees out of phase with said first signal;
      iii) a third signal having the first frequency $F_{LO}$ and being essentially 90 degrees out of phase with said first signal; and
      iv) a fourth signal having the first frequency $F_{LO}$ and being essentially 90 degrees out of phase with said second signal;
   b) second circuitry adapted to provide an in-phase signal based on said first signal and said third signal and a quadrature signal based on said second signal and said fourth signal; and
   c) filtering circuitry adapted to improve a quadrature accuracy of said in-phase signal and said quadrature signal and thereby provide an in-phase output signal and a quadrature output signal;
   wherein said in-phase signal and said quadrature signal have a second frequency equal to twice the first frequency $F_{LO}$ and said quadrature signal is essentially 90 degrees out of phase with said in-phase signal, and wherein said in-phase signal and said quadrature signal are provided to a transmit modulator to modulate a baseband signal.

12. The quadrature frequency doubling system of claim 11 wherein said first circuitry comprises phase shifting circuitry adapted to provide said first, second, third, and fourth signals based on a reference signal.

13. The quadrature frequency doubling system of claim 12 further comprising reference circuitry adapted to provide said reference signal having the frequency $F_{LO}$ to said phase shifting circuitry.

14. The quadrature frequency doubling system of claim 11 wherein said second circuitry comprises:
   a first multiplier adapted to provide said in-phase signal based on said first and third signals; and
   a second multiplier adapted to provide said quadrature signal based on said second and fourth signals.

15. The quadrature frequency doubling system of claim 14 wherein said first and said second multipliers comprise double balanced mixers.

16. The quadrature frequency doubling system of claim 14 wherein each of said first and said second multipliers comprise exclusive OR logic.

17. The quadrature frequency doubling system of claim 14 wherein said second circuitry further comprises a tuned load adapted to maximize an output power associated with said in-phase signal and said quadrature signal.

18. The quadrature frequency doubling system of claim 11 wherein said first said second, said third, said fourth, said in-phase, and said quadrature, said in-phase output, and said quadrature output signals are differential signals.

19. The quadrature frequency doubling system of claim 11 wherein said first circuitry is further adapted to provide said first, said second, said third, and said fourth signals as differential output signals, and said second circuitry is further adapted to provide said in-phase signal and said quadrature signal as differential signals.

20. A method for doubling a frequency of a reference signal comprising:
   in response to receiving a reference signal from an oscillator:
      providing a first signal having a first frequency $F_{LO}$;
      providing a second signal having the first frequency $F_{LO}$ and being essentially 45 degrees out of phase with said first signal;
      providing a third signal having the first frequency $F_{LO}$ and being essentially 90 degrees out of phase with said first signal;
   providing a fourth signal having the first frequency $F_{LO}$ and being essentially 90 degrees out of phase with said second signal; and
   providing an in-phase signal based on said first signal and said third signal and a quadrature signal based on said second signal and said fourth signal, wherein said in-phase signal and said quadrature signal have a second frequency equal to twice the first frequency $F_{LO}$ and said quadrature signal is essentially 90 degrees out of phase with said in-phase signal, and wherein said in-phase signal and said quadrature signal are provided to a transmit modulator to modulate a baseband signal.

21. The method of claim 20 wherein said providing said in-phase signal and said quadrature signal step comprises:
   multiplying said first and third signals, thereby providing said in-phase signal; and
   multiplying said second and fourth signals, thereby providing said quadrature signal.

22. The method of claim 20 further comprising improving a quadrature accuracy of said in-phase signal and said quadrature signal, thereby providing an in-phase output signal and a quadrature output signal.

23. The method of claim 20 wherein said first, second, third, fourth, in-phase, and quadrature signals are differential signals, thereby improving a signal-to-noise ratio of said in-phase signal and said quadrature signal.

24. A quadrature frequency doubling system comprising:
   means for receiving a reference signal from an oscillator;
   means for providing a first signal having a first frequency $F_{LO}$;

means for providing a second signal having the first frequency $F_{LO}$ and being essentially 45 degrees out of phase with said first signal;

means for providing a third signal having the first frequency $F_{LO}$ and being essentially 90 degrees out of phase with said first signal;

means for providing a fourth signal having the first frequency $F_{LO}$ and being essentially 90 degrees out of phase with said second signal; and means for providing an in-phase signal based on said first signal and said third signal and a quadrature signal based on said second signal and said fourth signal, wherein said in-phase signal and said quadrature signal have a second frequency equal to twice the first frequency $F_{LO}$ and said quadrature signal is essentially 90 degrees out of phase with said in-phase signal, and wherein said in-phase signal and said quadrature signal are provided to a transmit modulator to modulate a baseband signal.

25. The quadrature frequency doubling system of claim 24 wherein said providing said in-phase signal and said quadrature signal step comprises:

means for multiplying said first and third signals, thereby providing said in-phase signal; and means for multiplying said second and fourth signals, thereby providing said quadrature signal.

26. The quadrature frequency doubling system of claim 24 further comprising means for improving a quadrature accuracy of said in-phase signal and said quadrature signal, thereby providing an in-phase output signal and a quadrature output signal.

27. The quadrature frequency doubling system of claim 24 wherein said first, second, third, fourth, in-phase, and quadrature signals are differential signals, thereby improving a signal-to-noise ratio of said in-phase signal and said quadrature signal.

* * * * *